(12) United States Patent
Lin et al.

(10) Patent No.: US 6,541,787 B2
(45) Date of Patent: Apr. 1, 2003

(54) OPTICALLY ALIGNING A LOADPORT ON A PROCESS MACHINE BY TRANSMITTING LIGHT THROUGH A SYSTEM OF APERTURES

(75) Inventors: Andrew Lin, Yun-Lin (TW); Yi-Yu Liu, I-Lan (TW); Tung-Gan Cheng, Tainan (TW); Tung-Liang Wu, Hsin-Chu (TW); Hsueh-Cheng Lin, Pingtung (TW); Yaw-Wen Wu, Tainan (TW); Chia-Fu Tsai, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/837,814

(22) Filed: Apr. 18, 2001

(65) Prior Publication Data

US 2002/0155641 A1 Oct. 24, 2002

(51) Int. Cl.[7] .......................... G01N 21/86; G01V 8/00
(52) U.S. Cl. .................. 250/559.3; 414/217.1
(58) Field of Search .................. 250/559.3, 559.29, 250/548, 559.12; 356/399, 400, 401; 414/416, 217.1, 939, 217, 416.03, 416.08; 901/47

(56) References Cited

U.S. PATENT DOCUMENTS

| | | | | |
|---|---|---|---|---|
| 4,107,541 A | * | 8/1978 | Kirsch | 250/571 |
| 5,796,486 A | * | 8/1998 | Jacob | 356/375 |
| 5,956,150 A | * | 9/1999 | Kanne | 356/399 |
| 6,201,255 B1 | * | 3/2001 | Torchalski | 250/559.4 |
| 6,362,883 B1 | * | 3/2002 | Watkins | 356/399 |

* cited by examiner

Primary Examiner—Stephone B. Allen
Assistant Examiner—Christopher W. Glass
(74) Attorney, Agent, or Firm—Tung & Associates

(57) ABSTRACT

An apparatus and a method for aligning a loadport on a process machine are disclosed. The apparatus is constructed by a base plate, an alignment block mounted on the base plate, a light source and an optical detector. The alignment block is provided with an aperture extending longitudinally through the block, or formed in a T-shape extending both longitudinally and transversely through the block. The light source may be suitably a laser emission source, or a laser source that operates in a pulse mode. The diameter of the aperture provided in the alignment block should be sufficiently small, i.e. smaller than 5 mm, and preferably smaller than 3 mm.

20 Claims, 3 Drawing Sheets

… … …

OPTICALLY ALIGNING A LOADPORT ON A PROCESS MACHINE BY TRANSMITTING LIGHT THROUGH A SYSTEM OF APERTURES

FIELD OF THE INVENTION

The present invention generally relates to an apparatus and a method for aligning a loadport on a process machine and more particularly, relates to an apparatus for aligning a loadport on a process machine which consists of a base plate and an alignment block with an aperture therethrough for passage of an alignment laser beam and a method for using the apparatus.

BACKGROUND OF THE INVENTION

In the fabrication of a product, the product is usually processed at many work stations or processing machines. The transporting or conveying of partially finished products, or work-in-process (WIP) parts, is an important aspect in the total manufacturing process. The conveying of semiconductor wafers is especially important in the manufacturing of integrated circuit chips due to the delicate nature of the chips. Furthermore, in fabricating an IC product, a multiplicity of fabrication steps, i.e., as many as several hundred, is usually required to complete the fabrication process. A semiconductor wafer or IC chips must be transported between various process stations in order to perform various fabrication processes.

For instance, to complete the fabrication of an IC chip, various steps of deposition, cleaning, implantation, etching and passivation must be carried out before the chip can be packaged for shipment. Each of these fabrication steps must be performed in a different process machine, i.e. a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically guided vehicles or overhead transport vehicles that travel on predetermined routes or tracks. For the conveying of semiconductor wafers, the wafers are normally loaded into cassettes pods, such as SMIF (standard machine interface) or FOUP (front opening unified pod), and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rail of the conveying vehicle.

In an automatic material handling system (AMHS), stockers are used in conjunction with automatically guided or overhead transport vehicles, either on the ground or suspended on tracks, for the storing and transporting of semiconductor wafers in SMIF pods or in wafer cassettes. For instance, three possible configurations for utilizing a stocker may be provided. In the first case, a stocker is utilized for storing WIP wafers in SMIF pods and transporting them first to tool A, then to tool B, and finally to tool C for three separate processing steps to be conducted on the wafers. After the processing in tool C is completed, the SMIF pod is returned to the stocker for possible conveying to another stocker. The configuration in the first case is theoretically workable but hardly ever possible in a fabrication environment since the tools or processing equipment cannot always be arranged nearby to accommodate the processing of wafers in the stocker.

In the second case, a stocker and a plurality of buffer stations A, B and C are used to accommodate different processes to be conducted in tool A, tool B and tool C. A SMIF pod may be first delivered to buffer station A from the stocker and waits there for processing in tool A. Buffer stations B and C are similarly utilized in connection with tools B and C. The buffer stations A, B and C therefore become holding stations for conducting processes on the wafers. This configuration provides a workable solution to the fabrication process, however, requires excessive floor space because of the additional buffer stations required. The configuration is therefore not feasible for use in a semiconductor fabrication facility.

In the third case, a stocker is provided for controlling the storage and conveying of WIP wafers to tools A, B and C. After a SMIF pod is delivered to one of the three tools, the SMIF pod is always returned to the stocker before it is sent to the next processing tool. This is a viable process since only one stocker is required for handling three different processing tools, and in that no buffer station is needed. This configuration illustrates that the frequency of use of the stocker is extremely high since the stocker itself is used as a buffer station for all three tools. The accessing of the stocker is therefore more frequent than that required in the previous two configurations.

FIG. 1 illustrates a schematic of a typical automatic material handling system 20 that utilizes a central corridor 22, a plurality of bays 24 and a multiplicity of process machines 26. A multiplicity of stockers 30 are utilized for providing input/output to bay 24, or to processing machines 26 located on the bay 24. The central corridor 22 designed for bay lay-out is frequently used in an efficient automatic material handling system to perform lot transportation between bays. In this configuration, the stockers 30 of the automatic material handling system become the pathway for both input and output of the bay. Unfortunately, the stocker 30 frequently becomes a bottleneck for internal transportation. It has been observed that a major cause for the stockers 30 to be the bottleneck is the input/output ports of the stockers.

In modern semiconductor fabrication facilities, especially for the 200 mm or 300 mm FAB plants, automatic guided vehicles (AGV) and overhead hoist transport (OHT) are extensively used to automate the wafer transport process as much as possible. The AGV and OHT utilize the input/output ports of a stocker to load or unload wafer lots, i.e. normally stored in POUFs. FIG. 2 is a perspective view of an overhead hoist transport system 32 consisting of two vehicles 34,36 that travel on a track 38. An input port 40 and an output port 42 are provided on the stocker 30. As shown in FIG. 2, the overhead transport vehicle 36 stops at a position for unloading a FOUP 44 into the input port 40. The second overhead transport vehicle 34 waits on track 38 for input from stocker 30 until the first overhead transport vehicle 36 moves out of the way.

Similarly, the OHT system is used to deliver a cassette pod such as a FOUP to a process machine. This is shown in FIG. 3. A cassette pod 10 of the FOUP type is positioned on a loadport 12 of a process machine 14. The loadport 12 is frequently equipped with a plurality of locating pins 16 for the proper positioning of the cassette pod 10. A detailed perspective view of the FOUP 10 is shown in FIG. 4. The FOUP 10 is constructed by a body portion 18 and a cover portion 28. The body portion 18 is provided with a cavity 46 equipped with a multiplicity of partitions 48 for the positioning of 25 wafers of the 300 mm size. The body portion 18 is further provided with sloped handles 50 on both sides of the body for ease of transporting. On top of the body portion 18, is provided with a plate member 52 for gripping by a transport arm (not shown) of the OHT system (not shown).

When an OHT system is utilized to transport a cassette pod to a process machine, problems arise when the loadport of the process machine is not in alignment with the OHT system. Mis-positioned cassette pods on a loadport not only affects the operation of loading/unloading from the pod, but also in severe instances may cause the cassette pod to tip over and cause breakage of the wafers. Conventionally, a laser surveying instrument is used to align the cassette pod, i.e. or the loadport of the process machine, to an OHT system. While the laser equipment may be properly used in a pilot plant setup, it cannot be practically used in a fabrication facility for several reasons. First, the laser equipment is costly and difficult to operate. Secondly, the laser emission is harmful to human eyes and thus when used, disturbs other operators that are working in the same intra-bay. In a production facility, there are frequently 20 or 30 process machines lined up in an intra-bay area. It is therefore difficult or impossible to use laser for aligning one machine, while not disturbing the operations of the other machines.

In a new fabrication facility for 300 mm wafers, the OHT system is the most popularly used cassette transport system. It is therefore very important to be able to align all the cassette pods or the loadports of the process machine in a straight line in the same OHT intra-bay to assure the integrity of the fabrication process. To ensure minimum disturbance to the fabrication process, s the laser alignment equipment cannot be used in a fabrication facility for the alignment of a single process machine.

When installing a process machine, the center of the loadport of the machine must be aligned not only with an overhead hoist transport system, but also with the other loadports on the neighboring process machines in order to assure the accurate delivery of a cassette pod to the loadport. Conventionally, the loadport center is aligned manually by making mechanical measurements and by subsequent manual calibration. The manual alignment process is tedious, time consuming and inaccurate.

It is therefore an object of the present invention to provide an apparatus for aligning a loadport on a process machine that does not have the drawbacks or shortcomings of the conventional apparatus.

It is another object of the present invention to provide an apparatus for aligning a loadport on a process machine that is a simple mechanical device.

It is a further object of the present invention to provide an apparatus for aligning a loadport on a process machine that utilizes an alignment block provided with an aperture extending longitudinally through the block.

It is still another object of the present invention to provide an apparatus for aligning a loadport on a process machine that utilizes an alignment block with an aperture therethrough and an optical source.

It is yet another object of the present invention to provide an apparatus for aligning a loadport on a process machine which includes an alignment block with an aperture therethrough, a light source and an optical detector.

It is still another further object of the present invention to provide a method for aligning a loadport on a process machine that can be carried out by projecting a light beam through a small aperture in an alignment block mounted on the loadport.

SUMMARY OF THE INVENTION

In accordance with the present invention, an apparatus and a method for aligning a loadport on a process machine are provided.

In a preferred embodiment, an apparatus for aligning a loadport on a process machine can be provided which includes a base plate that has a planar top and bottom surface parallel to each other, the base plate has at least two vertical through holes adapted for mating to at least two locating pins on a top surface of the process machine; an alignment block which has a planar bottom surface that intimately mates the top planar surface of the base plate, the alignment block has an aperture extending longitudinally therethrough parallel with the bottom surface of the alignment block, the aperture has an entrance end, an exit end and an inside diameter not larger than 5 mm; a light source positioned juxtaposed to the entrance end of the aperture; and an optical detector situated to the exit end of the aperture for detecting any light transmitted through the aperture.

In the apparatus for aligning a loadport on a process machine, the aperture may be formed in a T-shape extending longitudinally and transversely through the alignment block with an image splitter mounted at an intersection of the T. The image splitter may be a mirror, while the alignment block may be integrally formed with the base plate. The base plate and the alignment block may be fabricated of a rigid material, or may be fabricated of a rigid plastic or aluminum. The light source may be a laser source, or a laser source that operates in a pulse mode. The alignment block may have a length not more than 150 mm, while the aperture in the alignment block may have a diameter not larger than 3 mm.

The present invention is further directed to a method for aligning a loadport on a process machine which can be carried out by the operating steps of: providing a base plate that has a planar top and bottom surface parallel to each other; mounting the base plate to a process machine by engaging at least two vertical through holes to at least two locating pins on a top surface of the process machine; providing an alignment block which has an aperture extending longitudinally therethrough parallel with a bottom surface of the alignment block, the aperture having an entrance end, an exit end and an inside diameter not larger than 5 mm; mounting the alignment block on the base plate by engaging a planar bottom surface of the block intimately to the top planar surface of the base plate; projecting a light beam into the entrance end of the aperture; and detecting any light transmitted through the aperture at the exit end of the aperture.

The method for aligning a loadport on a process machine may further include the step of forming the aperture in a T-shape extending longitudinally and transversely through the alignment block with an image splitter mounted at an intersection of the T. The method may further include the step of providing the image splitter in a mirror, or the step of forming the alignment block integrally with the base plate, or the step of fabricating the base plate and the alignment block in a rigid material, such as plastic or aluminum. The method may further include the step of providing the light source in a laser source form or as a laser source that operates in a pulse mode. The method may further include the step of forming the alignment block to a length not more than 150 mm, or the step of forming the aperture in the alignment block to a diameter not larger than 3 mm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
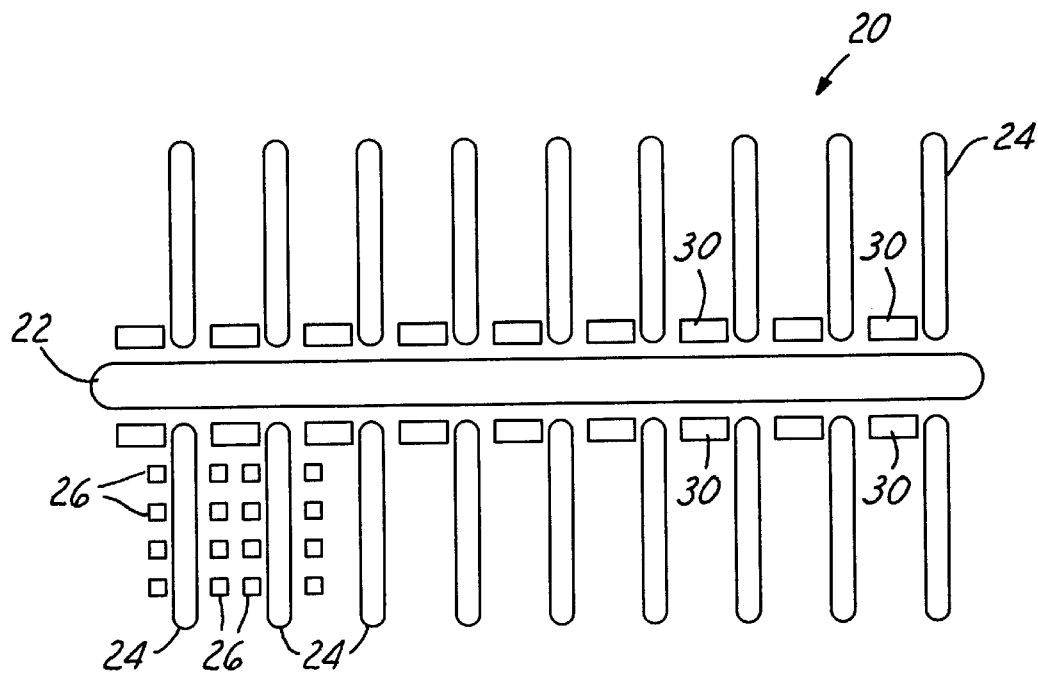
FIG. 1 is a schematic illustrating a conventional automatic material handling system utilizing a central corridor for intra-bay transport.
Figure 2:
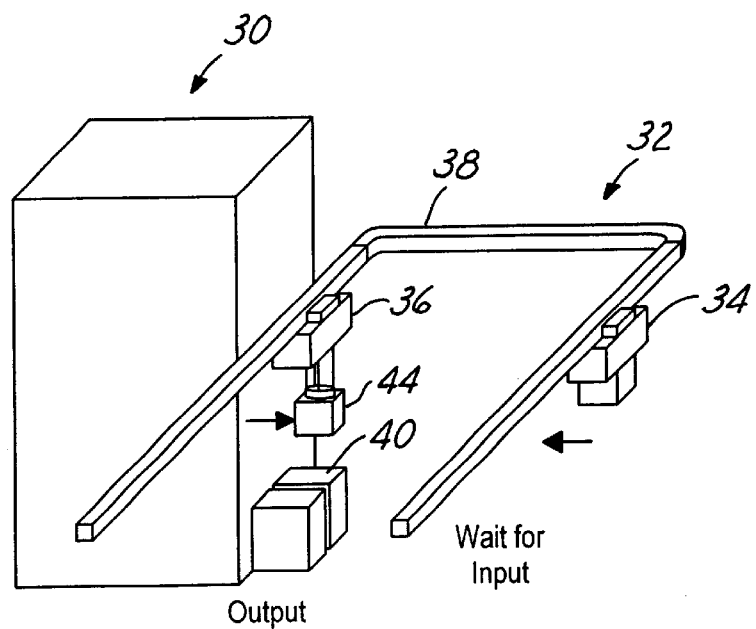
FIG. 2 is a schematic illustrating a conventional overhead hoist transport system for accessing a stocker.

The present invention discloses an apparatus and a method for alligning a loadport on a process machine.

The apparatus includes a base plate, an alignment block, a light source and an optical detector. The base plate may be fabricated of a planar top and bottom surface that are parallel to each other, the plate has at least two vertical through holes, and preferably three vertical through holes that are adapted for mating to at least two locating pins, and preferably three locating pins on a top surface of the process machine. The alignment block may have a planar bottom surface which intimately mates to the top planar surface of the base plate. The alignment block may have an aperture that extends longitudinally therethrough parallel with the bottom surface of the alignment block. The aperture may have an entrance end, an exit end and an inside diameter not larger than 5 mm. The light source, may be a pulsed laser source that is positioned juxtaposed to the entrance end of the aperture such that a light beam of small diameter, i.e. smaller than 3 mm, may be projected into the aperture. The optical detector is situated to the exit end of the aperture capable of detecting any light that is transmitted through the aperture.

The present invention alignment block may further be formed with an aperture that is T-shaped which extends both longitudinally and transversely through the alignment block with an image splitter, i.e. a mirror, mounted at an intersection of the T.

In the apparatus, the alignment block may be integrally formed with the base plate, or may be separately formed and then mechanically attached together. The base plate and the alignment block should be fabricated of a rigid material that has dimensional stability in the temperature range that the calibration process for the loadport is normally conducted. The alignment block may have a length of approximately 150 mm, and preferably not larger than 200 mm. The aperture provided in the alignment block may have a diameter not larger than 5 mm, and preferably not larger than 3 mm.

The present invention is a novel method for aligning a loadport, or a center of a loadport on a process machine which can be carried out by the steps of providing a base plate, mounting the base plate to a process machine, providing an alignment block, mounting the alignment block to the base plate, projecting a light beam into an aperture in the alignment block and detecting any light transmitted through the aperture at an exit end of the aperture. When the present invention method is carried out, the center of the loadport can be located when the laser beam passes the aperture in the alignment block. However, if the laser beam is blocked by the alignment block, the center of the loadport is displaced. The present invention therefore provides an easy method for locating the center of a loadport. The laser beam utilized can be a standard calibration type laser beam which provides a straight beam path. The two apertures provided in the T-shaped arrangement in the alignment block enables the present invention apparatus to be used for calibrating in all three directions, i.e. X-axis, Y-axis and Z-axis. The horizontal aperture provides the calibration in the X-axis and Y-axis, while the vertical aperture provides the calibration in the Z-axis. For instance, when the height of the loadport is 900 mm±5 mm, the vertical diameter of an ellipse is about 10 mm, i.e. the Z-axis tolerance. When a laser beam passes through both the horizontal aperture and the vertical aperture, the center of the loadport is located.

Figure 3:
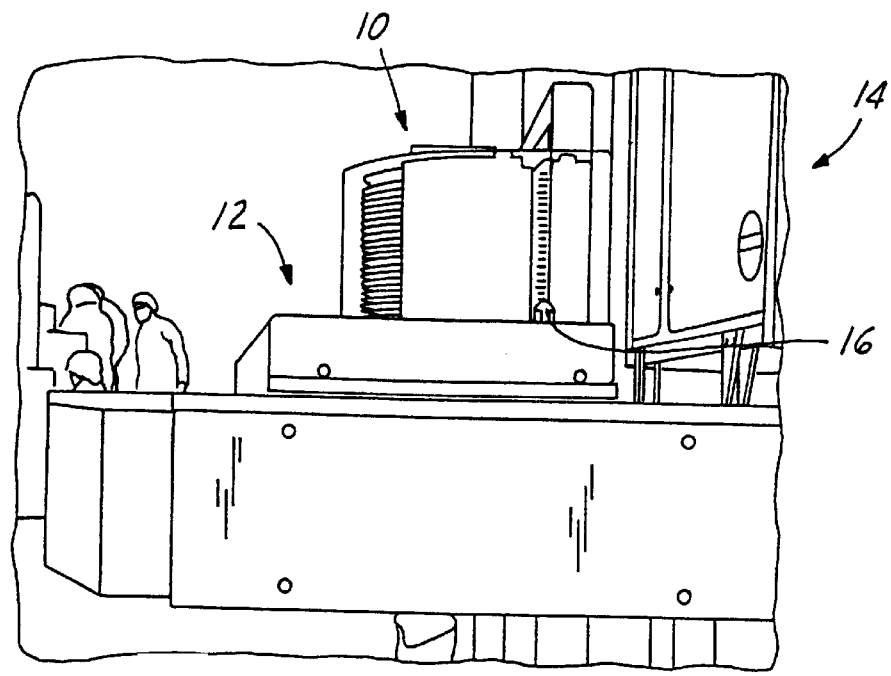
FIG. 3 is a graph illustrating a cassette pod positioned on a loadport of a process machine.
Figure 4:
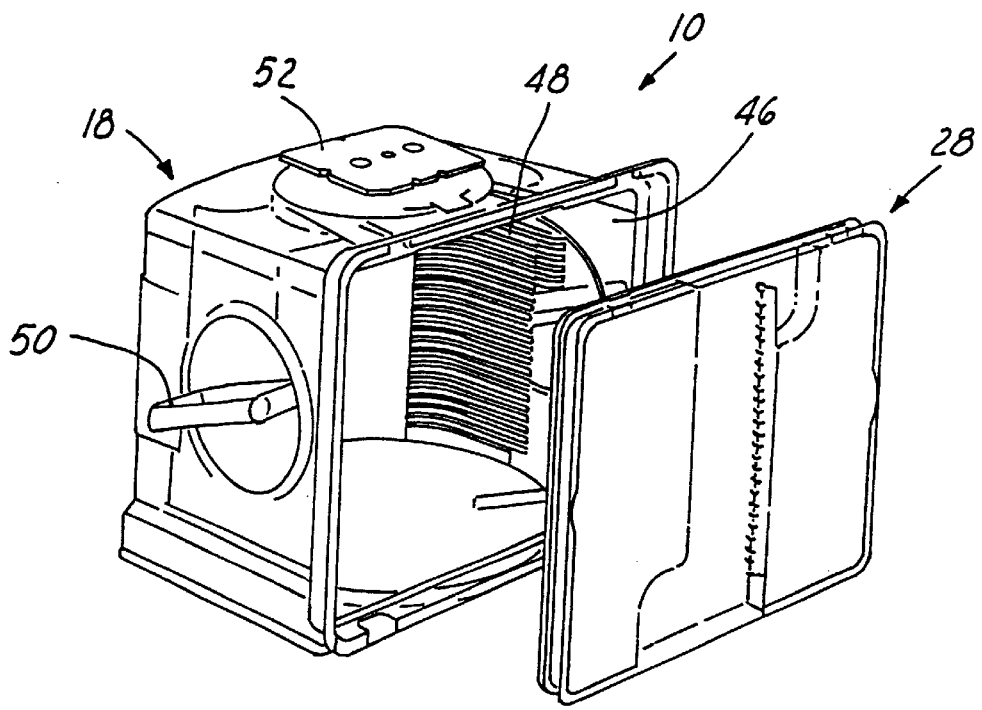
FIG. 4 is a perspective view of a front opening unified pod (FOUP).
Figure 5:
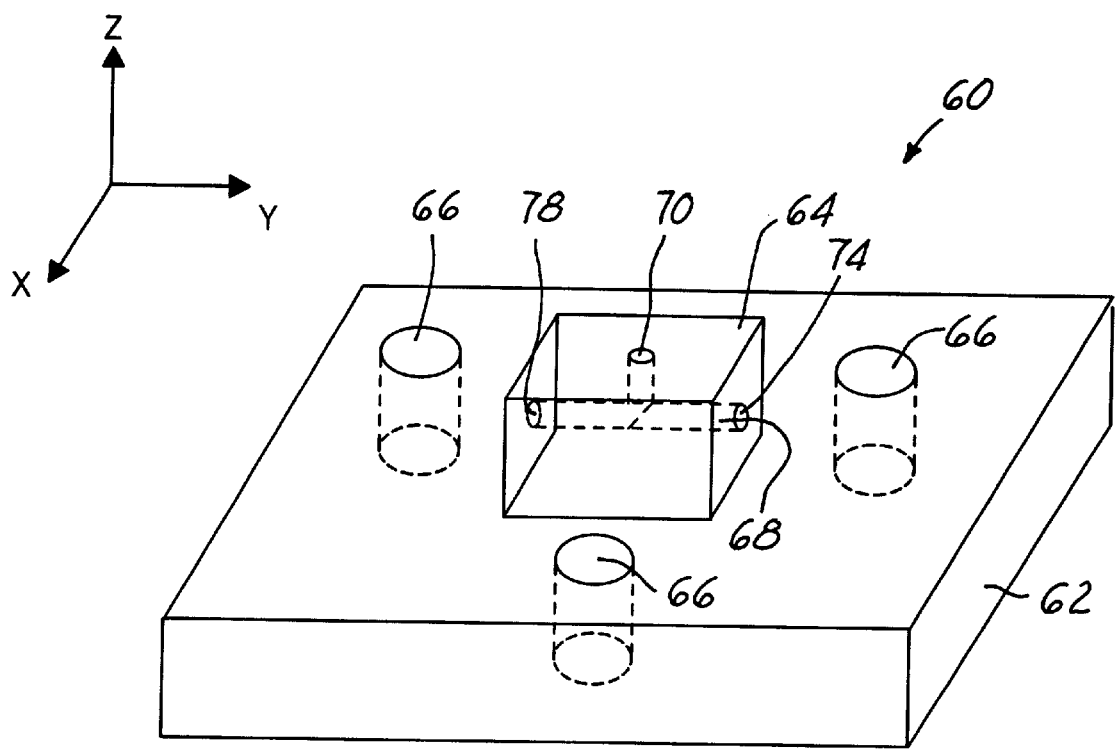
FIG. 5 is a perspective view of the present invention apparatus including a base plate and an alignment block.

Referring now to FIG. 5, a present invention apparatus 60 is shown. The apparatus 60 is constructed by a base plate 62 and an alignment block 64. The base plate 62 is provided with at least two locating holes 66, and preferably equipped with three locating holes as shown in FIG. 5 for mating to three locating pins 16 (shown in FIG. 3). The base plate 62 should be fabricated in a thermally stable and rigid material such as a rigid plastic or aluminum. The dimension of the base plate may be 350 mm length, 350 mm width and 30 mm thickness.

Figure 5A:
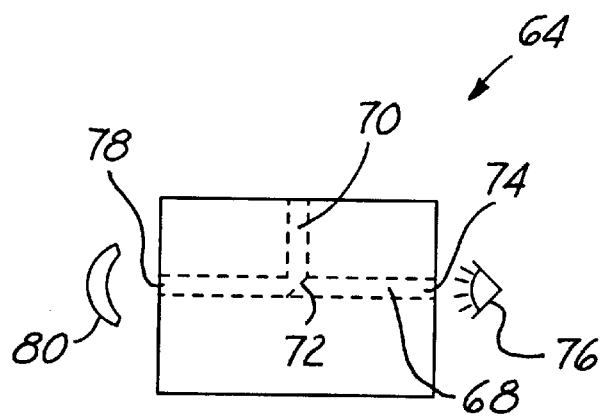
FIG. 5A is a side view of the present invention alignment block equipped with a light source and an optical detector.

An alignment block 64 is shown in both FIGS. 5 and 5A. The alignment block 64 is provided with a horizontal aperture 68 and a vertical aperture 70, with an image splitter 72 provided at the intersection of the two apertures 68,70. The diameter of the apertures 68, 70 should be less than 5 mm, and preferably less than 3 mm.

As shown in FIG. 5A, at the entrance end 74 of the horizontal aperture 68 is provided a light source 76 such as a laser source that operates in a pulse mode. At the exit end 78 of the horizontal aperture 68 is provided with an optical detector 80 for detecting any light that transmits through the horizontal aperture 68. When the image splitter 72 is used, a second optical detector (not shown) should be provided at the exit end of the vertical aperture 70. It should be noted that while it is desirable to provide the aperture in both the horizontal and vertical directions inside the alignment block 64, such is not always necessary. For instance, for certain calibration procedures, only the horizontal aperture 68 is required.

The alignment block 64 should be fabricated of a thermally stable, rigid material such as a rigid plastic or aluminum. A suitable dimension for the alignment block 64 may be 150 mm in length, 150 mm in width, and 150 mm in thickness.

The present invention novel apparatus and method for aligning a loadport on a process machine have therefore been amply described in the above description and in the appended drawings of FIGS. 5 and 5A.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. An apparatus for aligning a loadport on a process machine comprising:

a base plate having a planar top and bottom surface parallel to each other, said base plate having at least two vertical through holes adapted for mating to at least two locating pins on a top surface of said process machine;

an alignment block having a planar bottom surface which intimately mates said top planar surface of the base plate, said alignment block having an aperture extending longitudinally therethrough parallel with said bottom surface of the alignment block, said aperture having an entrance end, an exit end and an inside diameter not larger than 5 mm;

a light source positioned juxtaposed to said entrance end of the aperture; and an optical detector situated to said exit end of the aperture for detecting any light transmitted through said aperture.

2. An apparatus for aligning a loadport on a process machine according to claim 1, wherein said aperture being formed in a T-shape extending longitudinally and transversely through said alignment block with an image splitter mounted at an intersection of said T.

3. An apparatus for aligning a loadport on a process machine according to claim 2, wherein said image splitter is a mirror.

4. An apparatus for aligning a loadport on a process machine according to claim 1, wherein said alignment block being integrally formed with said base plate.

5. An apparatus for aligning a loadport on a process machine according to claim 1, wherein said base plate and said alignment block being fabricated of a rigid material.

6. An apparatus for aligning a loadport on a process machine according to claim 1, wherein said base plate and said alignment block being fabricated of a rigid plastic or aluminum.

7. An apparatus for aligning a loadport on a process machine according to claim 1, wherein said light source is a laser source.

8. An apparatus for aligning a loadport on a process machine according to claim 1, wherein said light source is a laser source that operates in a pulse mode.

9. An apparatus for aligning a loadport on a process machine according to claim 1, wherein said alignment block has a length not more than 150 mm.

10. An apparatus for aligning a loadport on a process machine according to claim 1, wherein said aperture in said alignment block having a diameter not larger than 3 mm.

11. A method for aligning a loadport on a process machine comprising the steps of:

providing a base plate having a planar top and bottom surface parallel to each other;

mounting said base plate to a process machine by engaging at least two vertical through holes to at least two locating pins on a top surface of said process machine;

providing an alignment block having an aperture extending longitudinally therethrough parallel with a bottom surface of the alignment block, said aperture having an entrance end, an exit end and an inside diameter not larger than 5 mm;

mounting said alignment block on said base plate by engaging a planar bottom surface of the block intimately to said top planar surface of the base plate;

projecting a light beam into said entrance end of the aperture; and detecting any light transmitted through said aperture at said exit end of the aperture.

12. A method for aligning a loadport on a process machine according to claim 11 further comprising the step of forming said aperture in a T-shape extending longitudinally and transversely through said alignment block with an image splitter mounted at an intersection of said T.

13. A method for aligning a loadport on a process machine according to claim 12 further comprising the step of providing said image splitter in a mirror.

14. A method for aligning a loadport on a process machine according to claim 11 further comprising the step of forming said alignment block integrally with said base plate.

15. A method for aligning a loadport on a process machine according to claim 11 further comprising the step of fabricating said base plate and said alignment block in a rigid material.

16. A method for aligning a loadport on a process machine according to claim 11 further comprising the step of fabricating said base plate and said alignment block in a rigid plastic or aluminum.

17. A method for aligning a loadport on a process machine according to claim 11 further comprising the step of providing said light source in a laser source.

18. A method for aligning a loadport on a process machine according to claim 11 further comprising the step of providing said light source in a laser source that operates in a pulse mode.

19. A method for aligning a loadport on a process machine according to claim 11 further comprising the step of forming said alignment block to a length not more than 150 mm.

20. A method for aligning a loadport on a process machine according to claim 11 further comprising the step of forming said aperture in said alignment block to a diameter not larger than 3 mm.

* * * * *